United States Patent
Lee et al.

(10) Patent No.: US 10,514,502 B2
(45) Date of Patent: Dec. 24, 2019

(54) BACK-SIDE ETCHING AND CLEAVING OF SUBSTRATES

(71) Applicant: Oracle International Corporation, Redwood Shores, CA (US)

(72) Inventors: Jin-Hyoung Lee, San Diego, CA (US); Ivan Shubin, San Diego, CA (US); Xuezhe Zheng, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 279 days.

(21) Appl. No.: 15/223,509

(22) Filed: Jul. 29, 2016

(65) Prior Publication Data

US 2016/0334577 A1 Nov. 17, 2016

Related U.S. Application Data

(62) Division of application No. 14/024,227, filed on Sep. 11, 2013, now Pat. No. 9,488,777.

(51) Int. Cl.
*G02B 6/13* (2006.01)
*G02B 6/122* (2006.01)
(Continued)

(52) U.S. Cl.
CPC .............. *G02B 6/13* (2013.01); *G02B 6/122* (2013.01); *G02B 6/136* (2013.01); *H01L 21/3065* (2013.01); *H01L 21/7806* (2013.01)

(58) Field of Classification Search
CPC ......... G02B 6/122; G02B 6/13; H01S 5/0202; H01L 21/78
(Continued)

(56) References Cited

U.S. PATENT DOCUMENTS 4,378,269 A * 3/1983 Matsushita ............. C30B 15/14
117/13
5,501,893 A 3/1996 Laermer et al.
(Continued)

OTHER PUBLICATIONS

Behfar, Alex et al. "Horizontal Cavity Surface-Emitting Laser (HCSEL) Devices" Vertical-Cavity Surface-Lasers IX, edited by Chun Lei, Kent D. Choquette, Proceedins of SPIE vol. 5737 (SPIE-Bellingham, WA 2005) 0277-786X/05/$15 doi: 10.1117/12.591069.

(Continued)

*Primary Examiner* — Seahvosh Nikmanesh
(74) *Attorney, Agent, or Firm* — Park, Vaughan, Fleming & Dowler LLP

(57) ABSTRACT

A fabrication technique for cleaving a substrate in an integrated circuit is described. During this fabrication technique, a trench is defined on a back side of a substrate. For example, the trench may be defined using photoresist and/or a mask pattern on the back side of the substrate. The trench may extend from the back side to a depth less than a thickness of the substrate. Moreover, a buried-oxide layer and a semiconductor layer may be disposed on a front side of the substrate. In particular, the substrate may be included in a silicon-on-insulator technology. By applying a force proximate to the trench, the substrate may be cleaved to define a surface, such as an optical facet. This surface may have high optical quality and may extend across the substrate, the buried-oxide layer and the semiconductor layer.

9 Claims, 5 Drawing Sheets

(51) Int. Cl.
  *G02B 6/136* (2006.01)
  *H01L 21/3065* (2006.01)
  *H01L 21/78* (2006.01)
(58) Field of Classification Search
  USPC .......................................... 438/700; 216/41
  See application file for complete search history.

(56) References Cited

U.S. PATENT DOCUMENTS

| | | | | |
|---|---|---|---|---|
| 6,514,875 | B1 * | 2/2003 | Yu | H01L 21/30608 |
| | | | | 134/1.3 |
| 7,052,927 | B1 * | 5/2006 | Fletcher | H01L 27/14634 |
| | | | | 438/455 |
| 9,488,777 | B2 * | 11/2016 | Lee | G02B 6/122 |
| 2001/0013608 | A1 | 8/2001 | Kobayashi et al. | |
| 2006/0110101 | A1 * | 5/2006 | Lin | G02B 6/136 |
| | | | | 385/16 |
| 2009/0065682 | A1 * | 3/2009 | Webster | G02B 6/1228 |
| | | | | 250/208.2 |
| 2011/0135265 | A1 * | 6/2011 | Park | G02B 6/13 |
| | | | | 385/129 |
| 2013/0114924 | A1 * | 5/2013 | Loh | G02B 6/1245 |
| | | | | 385/14 |

OTHER PUBLICATIONS

Shubin, Ivan et al. "Integration, processing and performance of low power thermally tunable CMOS-SOI WDM resonators" Optical and Quantum Electronics, vol. 38, Nos. 4/6 Mar./May 2006, ISSN 0306-8919, Opt. Quant Electron DOI 10.1007/s11082-012-9577-9.
Tachi, Shinichi et al. "Lowtemperature reactive ion etching and microwave plasma etching of silicon" Citation: Applied Physics Letters 52, 616 (1998); doi: 10.1063/1.99382, View online: http://dx.doi.org/10.1063/1.99382, view table of contents: http://scitation.aip.org/content/aip/journal/apl/52/8?ver_pdfcov. Published by the AIP Publishing. Integrated Engineering Software, Particle and Beam Ray Tracing Simulation.
Behfarad, A. et al. "Rectangular and Lshaped GaAs/AlGaAs lasers with very high quality etched facets" Citation: Applied Physics Letters 54, 493 (1989); doi: 10.1063/1.100960, View online: http://dx.doi.org/10.1063/1.100960, view table of contents: http://scitation.aip.org/content/aip/journal/apl/54/6?ver_pdfcov. Published by the AIP Publishing. Integrated Engineering Software, Particle and Beam Ray Tracing Simulation.
Abare, A.C. et al, 'Cleaved and Etched Facet Nitride Laser Diodes,' IEEE J. Select. Topics Quantum Electron., 4, No. 3, pp. 505 (1998). 1077-260X/98$10.00 1998 IEEE.

* cited by examiner

BACK-SIDE ETCHING AND CLEAVING OF SUBSTRATES

RELATED CASE

This application is a divisional application of, and hereby claims priority under 35 U.S.C. § 120 to, pending U.S. patent application Ser. No. 14/024,227, entitled "Back-Side Etching and Cleaving of Substrates," by inventors Jin Hyoung Lee, Ivan Shubin, Xuezhe Zheng and Ashok V. Krishnamoorthy, which was filed on 11 Sep. 2013, and which is hereby incorporated by reference.

GOVERNMENT LICENSE RIGHTS

This invention was made with Government support under Agreement No. HR0011-08-9-0001 awarded by DARPA. The Government has certain rights in the invention.

BACKGROUND

Field

The present disclosure generally relates to the fabrication of an optical facet on a substrate. More specifically, the present disclosure relates to fabrication of an optical facet on a substrate by defining a trench on the back side of the substrate.

Related Art

Optical signaling based on silicon photonics has the potential to alleviate off-chip bandwidth bottlenecks, as well as to provide low latency chip-to-chip communication. Optical interconnects with these capabilities can facilitate new system architectures that include multiple chips, with multi-threaded cores. These optical interconnects can provide: high-bandwidth, low-latency and energy-efficient data communication.

Silicon-photonic devices are typically processed and fabricated on silicon-on-insulator (SOI) wafers. The device-fabrication process is usually conducted in wafer scale using conventional CMOS processes. In order to optically access the silicon-photonic devices, optical facets are formed at the end of the input and output optical waveguides. High quality optical facets are usually needed to achieve minimum optical coupling loss when coupling optical signals in and out of the silicon-photonic devices. Because an optical signal is prone to scattering if it is incident on a rough interface or a surface with contaminants, it is often important that the optical facets are smooth, contamination and defect free to ensure a low optical coupling loss. Extra optical coupling loss at the optical facets can significantly degrade the overall silicon-photonic device performance, and can make the silicon-photonic devices less efficient. Therefore, high-quality optical input/output facets are typically very important to achieving high performance silicon-photonic devices.

Usually, an optical facet is formed as the final step of the fabrication process after device patterning, etching, passivation and metallization. A variety of techniques is available for processing the optical facet. Traditionally, optical facets are processed by either end-polishing or cleaving. In the end-polishing process, the optical facet edge is roughly defined by dicing, and the diced area is then mechanically polished using a fine-grid polishing machine. This time-consuming approach is usually implemented at chip scale, and it typically does not define the optical facet position with high accuracy.

Alternatively, cleaving is a natural separation process along the crystalline orientation in the semiconductor substrate. Because of the pristine optical facet quality, cleaving is often the preferred technique to form optical facets on silicon-photonic devices. However, cleaving is a mechanical process with many restrictions. For example, cleaving can usually only be applied to the periphery of chips having a minimum device size. Furthermore, cleaving usually only allows coarse optical facet positioning, unless the substrate is very thin (less than 100 μm), which can make the substrate difficult to handle.

Another technique used to create optical facets is dry etching. Because the etching mask is patterned by photolithography, this approach allows accurate optical facet positioning compared to other mechanical techniques. Optical facets on many III-V compound semiconductor devices with reasonable performance are often fabricated using dry etching. However, the dry-etching technique typically requires careful selection of different etching chemistries for different material compositions. Furthermore, the etched profile and surface roughness are often very sensitive functions of the etching conditions. Consequently, fine adjustments to the dry-etching technique are typically needed for different chips. If an optical device includes multiple material layers, the dry-etching technique can be even more complicated because each material layer may need to be addressed individually. In addition, despite the successful use of the dry-etching technique for III-V compound semiconductor devices, an efficient optical facet fabrication technique for SOI-based silicon-photonic devices has not been developed.

Hence, what is needed is a technique for fabricating an optical facet without the problems described above.

SUMMARY

One embodiment of the present disclosure provides a method for cleaving a substrate. During this method, a photoresist layer is disposed on a back side of a substrate having a thickness, where a buried-oxide layer is disposed on the front side of the substrate, and a semiconductor layer, which includes an optical waveguide having a symmetry axis, is disposed on the buried-oxide layer. Then, a first trench, having sides with a length, a width and a depth, is defined on the back side of the substrate, where the length is approximately perpendicular to the symmetry axis, and the depth is less than the thickness. Next, the substrate is cleaved to define a first surface by applying a force proximate to the first trench.

In some embodiments, prior to disposing the photoresist layer, the thickness is thinned to less than a predefined value, such as 300 μm. Alternatively or additionally, prior to disposing the photoresist layer, a mask pattern is defined on the back side of the substrate, where locations of the photoresist on the back side of the substrate are determined by the mask pattern. Moreover, prior to defining the mask pattern, the back side of the substrate may be polished.

Note that the first trench may be defined using a deep reactive ion etch.

Moreover, the photoresist may be patterned to facilitate defining the first trench. The first trench may have an aspect ratio of approximately ten. Furthermore, a difference between the thickness and the depth may be less than 100 μm.

Note that the substrate, the buried-oxide layer and the semiconductor layer may comprise a silicon-on-insulator technology.

In some embodiments, the optical waveguide is designed to convey an optical signal having a wavelength, and the first surface has a roughness, defined as a standard deviation in a mean position of the first surface, which is significantly less than the wavelength. The first surface may correspond to a crystal plane of the substrate. Moreover, the first surface may extend across the semiconductor layer, the buried-oxide layer and the substrate. If a cladding layer is disposed on the semiconductor layer, the first surface may extend across the cladding layer. Additionally, the first surface may be located at: a corner of the substrate; a portion of a side of the substrate; and/or in a cavity defined, in part, by the first surface away from sides of the substrate.

In some embodiments, a second trench having sides with a length, a width and a depth, is defined on the back side of the substrate, where the length is approximately parallel to the symmetry axis, and the depth is less than the thickness. In these embodiments, the substrate may be cleaved to define a second surface by applying a force proximate to the second trench. The second surface may be approximately perpendicular to the first surface. Note that the second surface may have a roughness, defined as a standard deviation in a mean position of the second surface, which is significantly less than the wavelength. Furthermore, the second surface may correspond to a second crystal plane of the substrate.

Another embodiment provides an integrated circuit that includes the first surface and/or the second surface. For example, the first surface and/or the second surface may be at a location other than a periphery of the substrate.

Another embodiment provides a system that includes the integrated circuit.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an integrated circuit, a system that includes the integrated circuit, and a method for cleaving a substrate in the integrated circuit are described. During this fabrication technique, a trench is defined on a back side of a substrate. For example, the trench may be defined using photoresist and/or a mask pattern on the back side of the substrate. The trench may extend from the back side to a depth less than a thickness of the substrate. Moreover, a buried-oxide layer and a semiconductor layer may be disposed on a front side of the substrate. In particular, the substrate may be included in a silicon-on-insulator (SOI) technology. By applying a force proximate to the trench, the substrate may be cleaved to define a surface, such as an optical facet. This surface may have high optical quality and may extend across the substrate, the buried-oxide layer and the semiconductor layer.

By facilitating fabrication of the surface, the fabrication technique may allow high-quality (i.e., low optical coupling loss) optical facets to be defined at arbitrary locations on the integrated circuit. Moreover, these optical facets may be fabricated without using mechanical polishing. This capability may allow unique device configurations to be fabricated at wafer scale, with high yield, low cost and high performance. Consequently, the fabrication technique may enable the use of optical interconnects based on silicon-photonic devices and, thus, improved performance in applications such as high-performance computing.

We now describe embodiments of the fabrication technique. This fabrication technique may facilitate cleaving of SOI-based photonic chips (and/or wafers) using back-side silicon-substrate etching. In particular, the back-side-etching assisted cleaving creates high-quality optical coupling facets for silicon-photonic chips with accurate facet positioning. This fabrication technique may leverage photolithography for accurate optical facet positioning, and may use back-side substrate cleaving to achieve high-quality optical coupling facets for the SOI devices on the front side of the substrate. Because the fabrication technique may only require processing on the silicon substrate on the back side of the SOI chip, a well-understood silicon deep-etching process may be used regardless of the details of the front-side multi-layer structure, thereby improving the reproducibility and yield of the optical facets. Furthermore, the photolithographic pattern positioning of the optical facet location may allow an optical coupling facet to be fabricated wherever is needed on the chip (or wafer), and the cleaving may ensure the optical facet quality.

Figure 1:
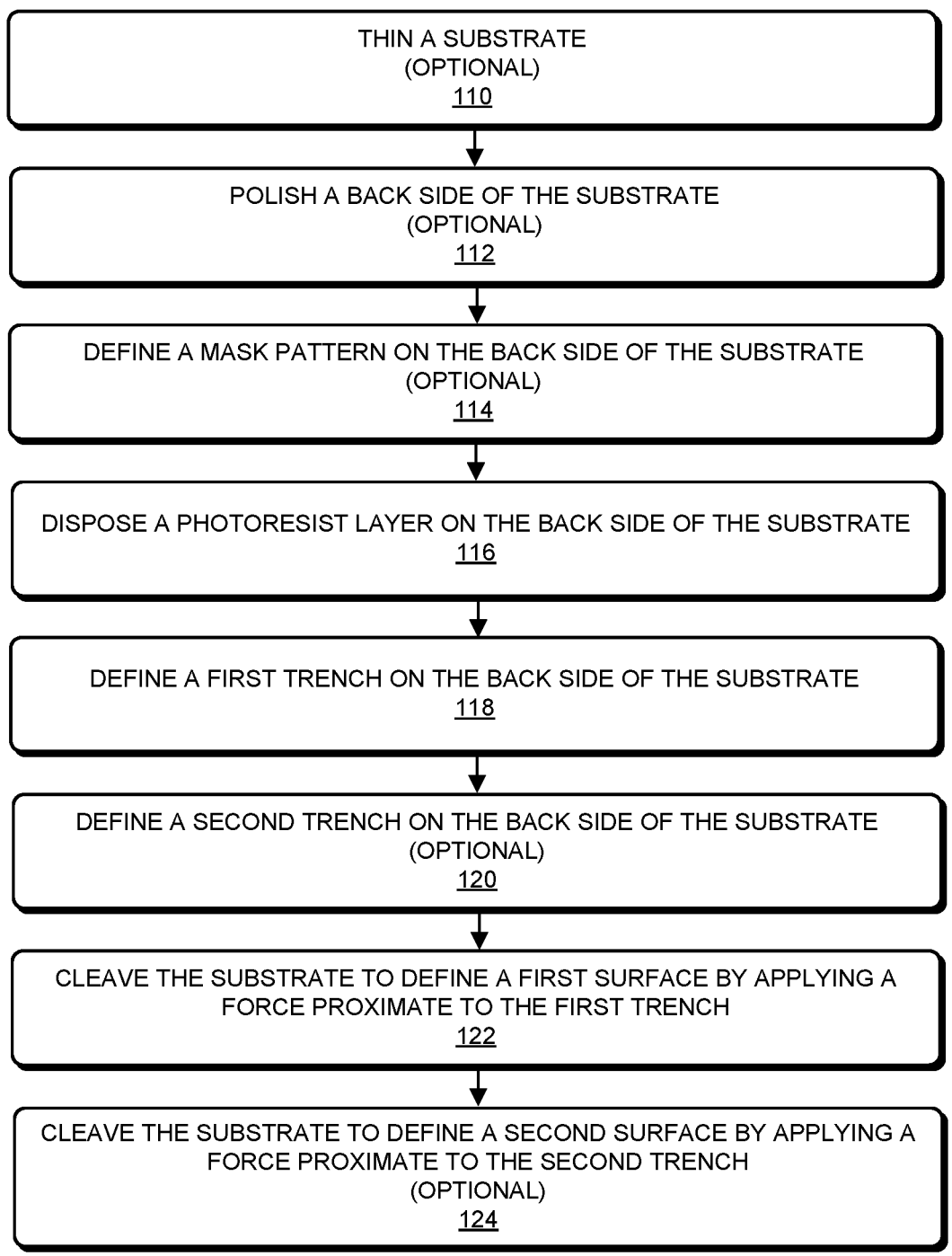
FIG. 1 is a flow diagram illustrating a method for cleaving a substrate in accordance with an embodiment of the present disclosure.

FIG. 1 presents a flow diagram illustrating a method 100 for cleaving a substrate. During this method, a photoresist layer is disposed on a back side of a substrate (operation 116) (such as a semiconductor die, a chip or a wafer) having a thickness, where a buried-oxide layer is disposed on the front side of the substrate, and a semiconductor layer, which includes an optical waveguide having a symmetry axis, is disposed on the buried-oxide layer. The substrate, the buried-oxide layer and the semiconductor layer may comprise a silicon-on-insulator technology. Therefore, the semiconductor layer may include silicon.

Then, a first trench, having sides with a length, a width and a depth, is defined on the back side of the substrate (operation 118), where the length is approximately perpendicular to the symmetry axis, and the depth is less than the thickness. Note that the first trench may be defined using a deep reactive ion etch (DRIE). (More generally, a variety of fabrication techniques may be used to define the first trench.) The first trench may have an aspect ratio of approximately ten. For example, the width may be 25-50 μm and the depth may be 60-100 μm short of the buried-oxide layer. Thus, a difference between the thickness and the depth may be less than 100 μm.

Next, the substrate is cleaved to define a first surface by applying a force proximate to the first trench (operation 122). In some embodiments, the optical waveguide is designed to convey an optical signal having a wavelength (such as a carrier or fundamental wavelength), and the first surface has a roughness, defined as a standard deviation in a mean position of the first surface, which is significantly less than the wavelength (ideally, the roughness may be zero). Moreover, the first surface may correspond to a crystal plane of the substrate. Furthermore, the first surface may extend across the semiconductor layer, the buried-oxide layer and the substrate. If a cladding layer (such as silicon dioxide or silicon nitride) is disposed on the semiconductor layer, the first surface may also extend across the cladding layer. As described further below with reference to FIGS. 3-5, the first surface may be located at: a corner of the substrate; a portion of a side of the substrate; and/or in a cavity defined, in part, by the first surface away from sides of the substrate.

In some embodiments, prior to disposing the photoresist layer (operation 116), the thickness of the substrate is optionally thinned (operation 110) to less than a predefined value, such as 300 µm. For example, the thickness may be thinned from 800-900 µm down to 100-200 µm. Alternatively or additionally, prior to disposing the photoresist layer (operation 116), a mask pattern is optionally defined on the back side of the substrate (operation 114), where locations of the photoresist on the back side of the substrate are determined by the mask pattern. This mask pattern may be used to pattern the photoresist to facilitate defining the trench. Moreover, prior to defining the mask pattern (operation 114), the back side of the substrate may be optionally polished (operation 112).

In some embodiments of method 100, there are additional or fewer operations. For example, a second trench having sides with a length, a width and a depth, may be defined on the back side of the substrate (operation 120), where the length is approximately parallel to the symmetry axis, and the depth is less than the thickness. In these embodiments, the substrate may be cleaved to define a second surface by applying a force proximate to the second trench (operation 124). The second surface may be approximately perpendicular to the first surface. Note that the second surface may have a roughness, defined as a standard deviation of a mean position of the second surface, which is significantly less than the wavelength. Moreover, the second surface may correspond to a second crystal plane of the substrate.

While the preceding discussion used etching as an illustration of a technique for defining the first and/or the second trench, more generally the fabrication technique may involve an additive process (i.e., one in which material is deposited or disposed on a surface) and/or a subtractive process (i.e., one in which material is removed from a surface).

Additionally, the order of the operations in method 100 may be changed, and/or two or more operations may be combined into a single operation.

Figure 2:
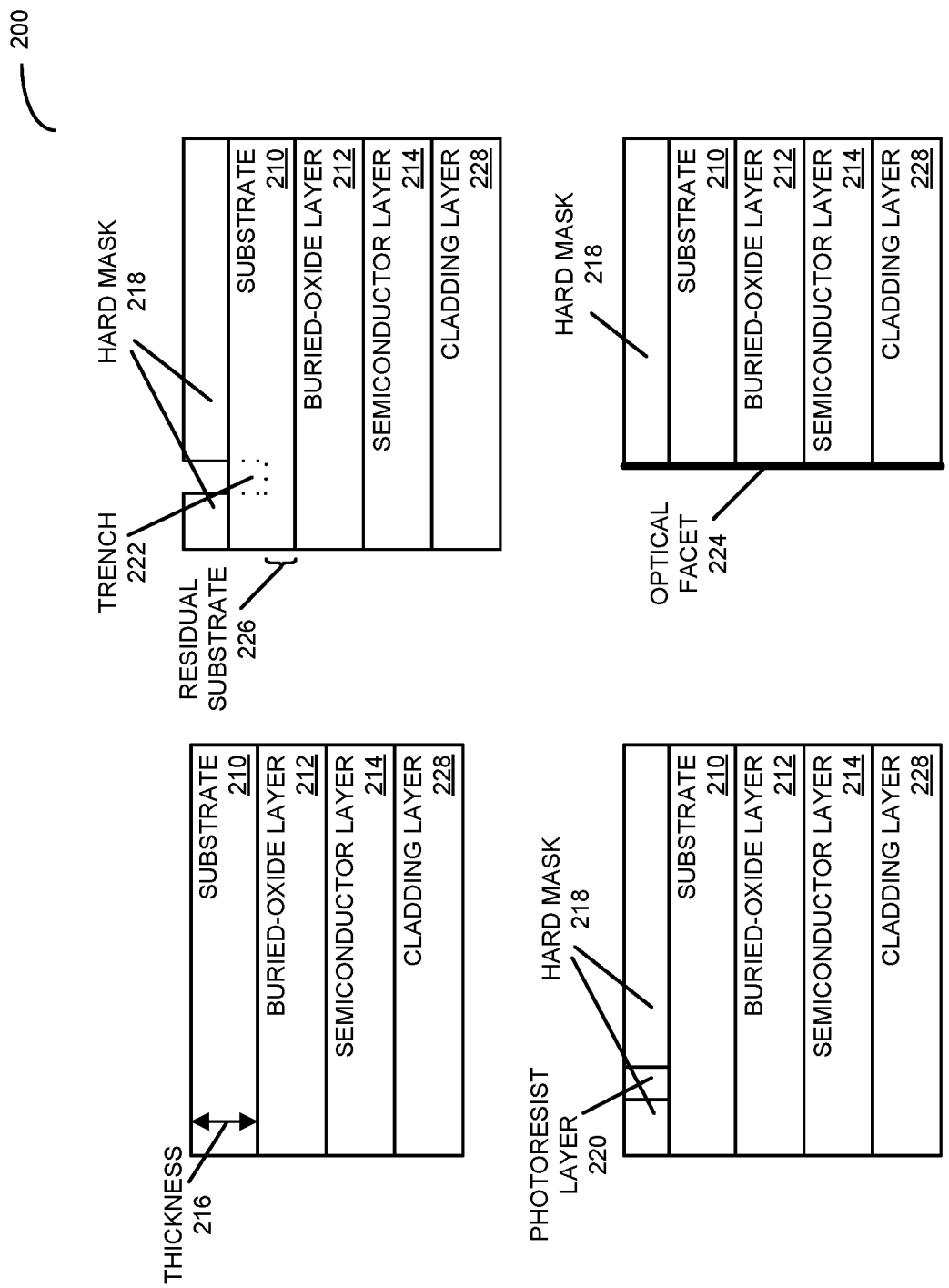
FIG. 2 is a flow diagram illustrating a method for cleaving a substrate in accordance with an embodiment of the present disclosure.

The fabrication technique is further illustrated in FIG. 2, which presents a flow diagram illustrating a method 200 for cleaving a substrate using back-side etching. In FIG. 2, after completion of front-side optical device processing on a SOI or a silicon-substrate platform, the back side of the silicon substrate may be polished, e.g., using chemical mechanical polishing. In the discussion that follows, a SOI platform is used as an illustration, including: substrate 210, buried-oxide layer 212, and semiconductor layer 214 (which includes the optical waveguide). Note that semiconductor layer 214 may have a thickness between 100 nm and 3 µm, and buried-oxide layer 212 may have a thickness between 0.3 and 3 µm (such as 0.8 µm).

While it is not required, substrate 210 may be optionally thinned down from its original thickness to a thickness 216 less than 300 µm. This chip thinning may reduce the amount of DRIE needed, and may facilitate a particular aspect ratio of the resulting etched back-side trench.

Then, a hard mask (or mask pattern) 218 may be deposited on the polished back side of the chip (e.g., a sufficiently thick silicon-dioxide layer may be deposited using plasma enhanced chemical vapor deposition or another fabrication technique). Back-to-front-side alignment may be performed when a photoresist layer 220 is patterned on the back side, and its pattern may be transferred to the hard mask. Note that photoresist layer 220 may be used alone (i.e., without the hard mask) provided that photoresist layer 220 is sufficiently thick (such as several microns thick) and can withstand the DRIE etching technique so that it lasts through the DRIE duration. If hard mask 218 is used, it may be defined or formed so that trench 222 is formed on the back side perpendicular to the optical waveguide in the chip, and is positioned where the optical waveguide is to be terminated with optical facet 224.

The SOI photonic chip with the patterned hard mask 218 and/or photoresist layer 220 then goes through the DRIE silicon-etching technique to form deep trench 222 at the desired optical facet location. Note that DRIE is a highly anisotropic etching technique that results in a nearly 90° sidewall extending through the etched thickness with an aspect ratio up to 1:10. Examples of such a DRIE etching technique include the $CHF_3/SF_6$ Bosch process conducted at room temperature and the $SF_6/O_2$ cryogenic process. During the DRIE etching technique, substrate 210 may be etched through most or all of its thickness, leaving less than 50 µm of residual substrate 226 in trench 222 before reaching buried-oxide layer 212. The residual substrate 226 may be important for high-quality cleaving because silicon crystallographic planes may facilitate the cleaving.

After the back-side silicon etching, a gentle force may be applied to the front or back side of the etched chip near or proximate to trench 222, so that the chip is naturally cleaved along the etched trench 222. Note that the cleaving may not be limited by the size of the chip, so that it may be possible to cleave optical waveguide devices that are much less than 1 mm long. Because of the accuracy of back-to-front side alignment attainable with standard photolithographic tools, as well as the highly anisotropic etched trenches, cleaved optical facets may be obtained using the fabrication technique with a position accuracy of several microns.

In an exemplary embodiment, the fabrication technique was used to define an optical facet on a SOI photonics chip with a thick (such as several microns thick) silicon-nitride cladding layer 228 on the front side. After the back-side etching and cleaving, the silicon-nitride interface may exhibit a pristine quality optical facet with a smooth surface and a vertical side-wall.

In principle, the fabrication technique may allow the optical facet to be defined anywhere on the chip and, because the trenches are defined using photolithography, can be applied to a wafer-scale process. In particular, because the trench is defined on the back side of substrate 210, the trench can be fabricated regardless of the device layer composition on the front side of the chip (such as a multilayer stack that includes a silicon optical waveguide, a dielectric cladding layer, a metallization layer and a passivation layer), and the device layer can be protected from exposure to the etchants. Thus, the fabrication technique may be used to define optical facets on chips that include a wide variety of optical devices and/or configurations, such as: a single-mode silicon optical waveguide, a high index of refraction dielectric spot-size converter (with a dielectric or high index of refraction polymer optical waveguide, and a low index of refraction cladding layer), and/or a full-flow SOI chip. Furthermore, the fabrication technique may allow high-quality optical facets to be created on silicon-photonic devices with sufficient accuracy, quality and device reliability.

Additionally, because the fabrication technique can be applied to a wafer-level process, it may allow optical facets and die separation to be achieved simultaneously on multiple devices throughout a wafer. In the process, the fabrication technique may: reduce device processing operations, improve device packaging yield, and provide flexibility in hybrid chip-to-chip optical integration. Therefore, the fabrication technique may provide an economical solution for high-quality SOI silicon-photonic chip termination at the wafer-level scale, while improving yield and manufacturability.

Figure 3:
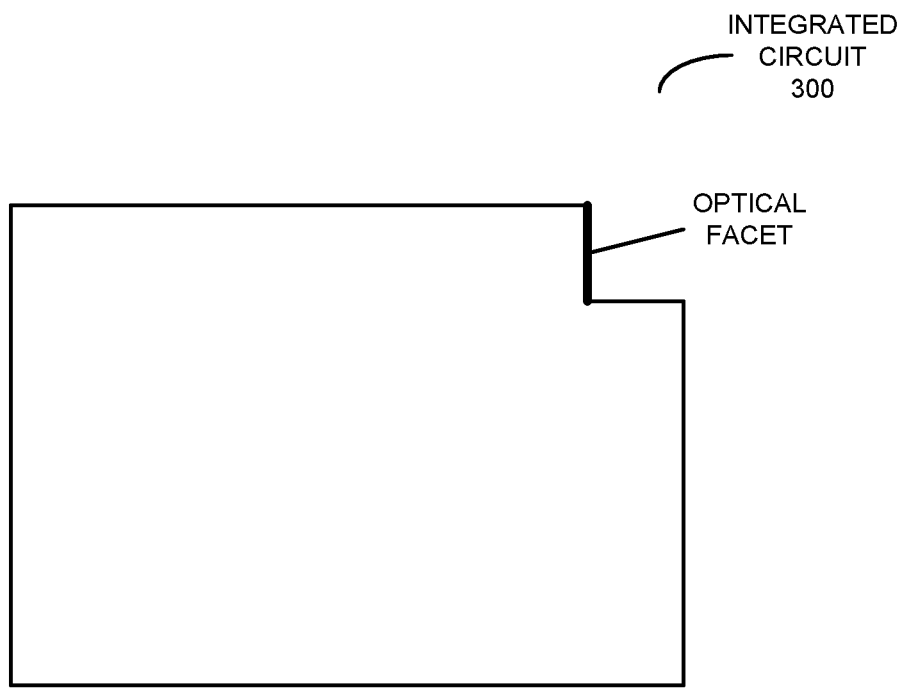
FIG. 3 is a block diagram illustrating a top view of an integrated circuit in accordance with an embodiment of the present disclosure.
Figure 4:
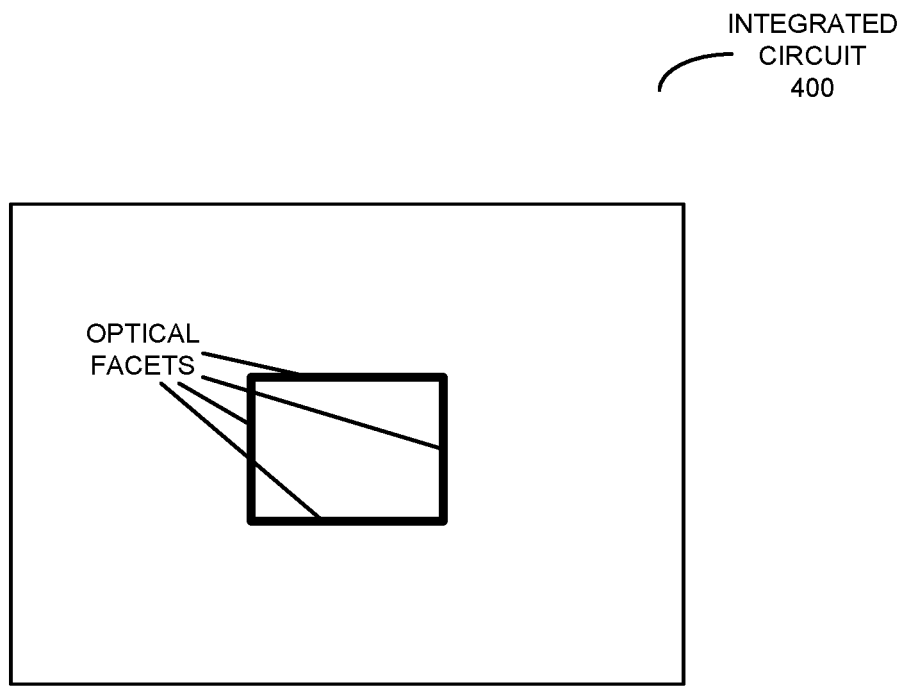
FIG. 4 is a block diagram illustrating a top view of an integrated circuit in accordance with an embodiment of the present disclosure.
Figure 5:
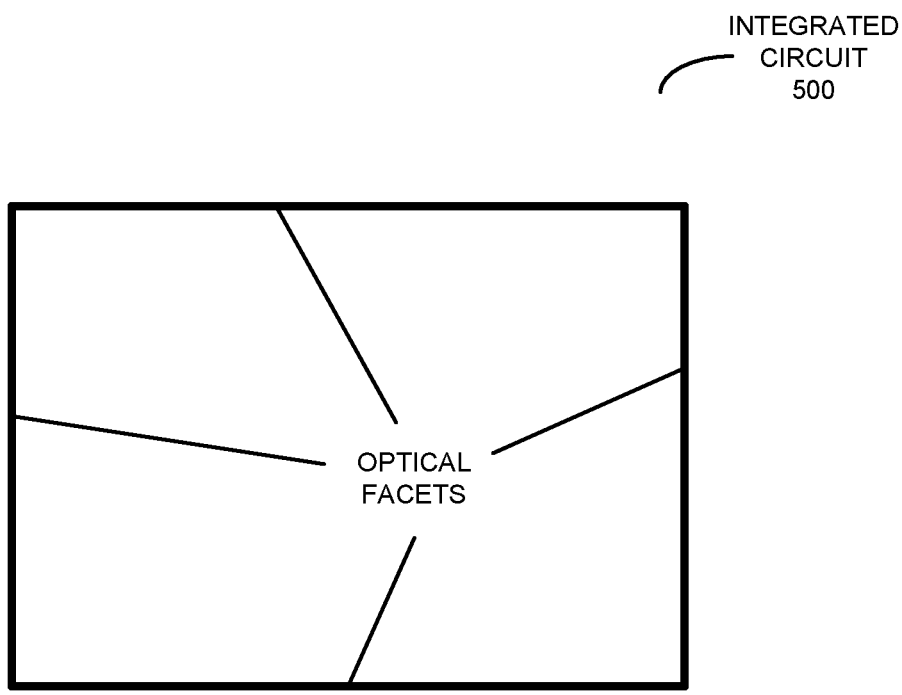
FIG. 5 is a block diagram illustrating a top view of an integrated circuit in accordance with an embodiment of the present disclosure.

As noted previously, the fabrication technique may be used to define an optical facet at any desirable location on a chip (as opposed to only at the periphery or edge of a chip), which may allow flexibility for external light-coupling configurations and chip-to-chip optical coupling. For example, as shown in FIG. 3, which presents a block diagram illustrating a top view of an integrated circuit 300, an optical facet may be formed at the corner of a chip with minimum processing area. Alternatively or additionally, as shown in FIG. 4, which presents a block diagram illustrating a top view of an integrated circuit 400, optical facets may be formed in the middle of a chip by back-side etching with a rectangular-type etch pattern. Furthermore, as shown in FIG. 5, which presents a block diagram illustrating a top view of an integrated circuit 500, optical facets may be formed on all four edges of a chip. One or more of these design options may significantly increase the flexibility of chip-to-chip optical coupling for heterogeneous optical devices processed on different semiconductor substrates. Additionally, the fabrication technique may facilitate single-layer optical integration with heterogeneous devices.

In some embodiments, the fabrication technique is used for die separation for a membrane-type or fragile-chip device. A membrane-type device may only have a few tens or hundreds of nanometers of residual membrane thickness, and thus may require very special chip handling. These MEMS devices are often found in sensor applications, as well as in photonics where high-thermal isolation is needed for low-power device operation. However, the membrane-type devices are often very fragile, are not mechanically stable and, thus, are not suitable for die separation using a dicing saw. The back-side etching and cleaving in the fabrication technique may be used for die separation in these cases because the die separation in the fabrication technique may be sufficiently gentle. For example, the die separation may not produce vibration and may not exert forces that could be detrimental to device membranes. In particular, using the fabrication technique, a separation line or trench can be defined by back-side silicon etching and then cleaved using little pressure on the front or the back side of the substrate. This approach may also allow local die removal on a chip when material needs to be removed, such as the rectangular channel shown in the center of FIG. 4. Thus, the fabrication technique may allow considerable flexibility for post processing of a chip that requires special handling restrictions because of its fragile nature.

Figure 6:
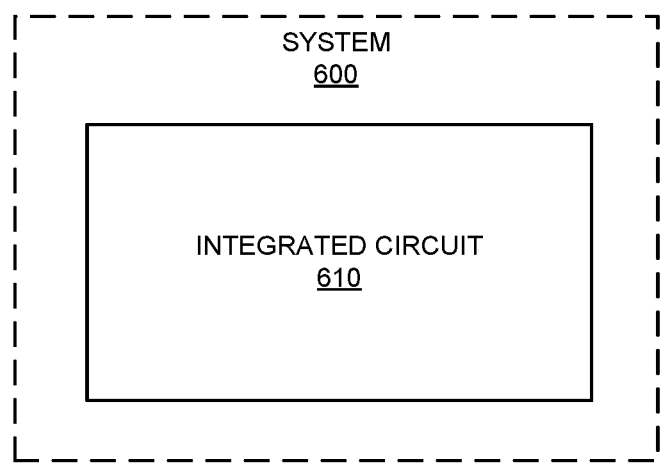
FIG. 6 is a block diagram illustrating a system that includes an integrated circuit in accordance with an embodiment of the present disclosure.

We now describe embodiments of the system. FIG. 6 presents a block diagram illustrating a system 600 that includes an integrated circuit 610, such as one of integrated circuits 300 (FIG. 3), 400 (FIG. 4) and 500 (FIG. 5). System 600 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, and/or another electronic computing device. Note that a given computer system may be at one location or may be distributed over multiple, geographically dispersed locations.

Integrated circuit 300 (FIG. 3), integrated circuit 400 (FIG. 4), integrated circuit 500 (FIG. 5) and system 600 may include fewer components or additional components. Moreover, the substrates may include: a semiconductor die (such as silicon), a ceramic, an organic material and/or glass.

Although the integrated circuits and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. In addition, functionality in the preceding embodiments may be implemented more in hardware and less in software, or less in hardware and more in software, as is known in the art.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit (IC), comprising:
   a substrate having a first surface;
   a buried-oxide layer, disposed on the substrate, having a second surface, wherein the first surface and the second surface are on opposite sides of the substrate; and
   a semiconductor layer, disposed on the buried-oxide layer, having a third surface, wherein the integrated circuit includes an optical facet that includes the first surface, the second surface and the third surface, wherein the optical facet is perpendicular to a plane of the substrate such that the optical facet has a smooth surface and a vertical side-wall that exposes the semiconductor layer disposed on the buried-oxide layer and the buried-oxide layer disposed on the substrate; and
   wherein the first surface defines, in part, a cavity within the IC.

2. The integrated circuit of claim 1, wherein the substrate was thinned to a thickness of 300 µm.

3. The integrated circuit of claim 1, wherein the back side of the substrate is polished.

4. The integrated circuit of claim 1, wherein the first surface is located at one of:
   a corner of the substrate;
   a portion of a side of the substrate; and
   in the cavity defined, in part, by the first surface away from sides of the substrate.

5. The integrated circuit of claim 1, wherein the substrate, the buried-oxide layer and the semiconductor layer comprise a silicon-on-insulator technology.

6. The integrated circuit of claim 1, wherein the semiconductor layer includes an optical waveguide having a symmetry axis, wherein the optical waveguide is designed to convey an optical signal having a wavelength; and
   wherein the first surface has a roughness, defined as a standard deviation in a mean position of the first surface, which is less than the wavelength.

7. The integrated circuit of claim 1, wherein the first surface extends across the semiconductor layer, the buried-oxide layer and the substrate.

8. The integrated circuit of claim 1, wherein a cladding layer is disposed on the semiconductor layer; and
   wherein the first surface extends across the cladding layer.

9. The integrated circuit of claim 1, wherein the first surface is oriented along a crystal plane of the substrate.

\* \* \* \* \*